United States Patent [19]

Eitel

[11] 4,378,626

[45] Apr. 5, 1983

[54] COOLED MIRROR CONSTRUCTION BY CHEMICAL VAPOR DEPOSITION

[75] Inventor: Frederick G. Eitel, North Palm Beach, Fla.

[73] Assignee: United Technologies Corporation, Hartford, Conn.

[21] Appl. No.: 272,426

[22] Filed: Jun. 10, 1981

[51] Int. Cl.³ .................. B22D 11/126; B23P 15/26
[52] U.S. Cl. ............... 29/527.2; 29/157.3 R; 29/157.4; 29/157.3 C; 29/527.1
[58] Field of Search ........... 29/727, 157.3 R, 157.3 C, 29/157.4, 527.1, 527.2

[56] References Cited

U.S. PATENT DOCUMENTS 3,784,152  1/1974  Garner et al. ............... 29/527.2

Primary Examiner—Lowell A. Larson
Assistant Examiner—V. K. Rising
Attorney, Agent, or Firm—Eric W. Petraske

[57] ABSTRACT

A cooled mirror for high power optical systems is fabricated by chemical vapor deposition of material on coolant tube forms.

4 Claims, 3 Drawing Figures

COOLED MIRROR CONSTRUCTION BY CHEMICAL VAPOR DEPOSITION

DESCRIPTION

TECHNICAL FIELD

The field of the invention is the fabrication of cooled mirrors for use in high power optical systems.

BACKGROUND ART

It is known in the art to form a cooled mirror for a high power laser by combining a rigid substrate with a faceplate having a number of channels through which coolant is flowed during the system operation. Conventionally, the faceplate is attached to the substrate by brazing, a high temperature process which tends to introduce distortions in the optical faceplate and to leave residual stresses in the finished mirror. Copending U.S. patent application Ser. No. 251,680 by John Bluege illustrates the attachment of a faceplate to a substrate by use of chemical vapor deposition to form a bond between the two pieces, thus reducing the amount of stress because chemical vapor deposition is a lower temperature process than brazing. U.S. Pat. No. 4,133,369 issued to Maire et al illustrates the fabrication of a conventional heat exchanger by a variety of plating methods including chemical deposition.

DISCLOSURE OF INVENTION

The invention relates to a method of forming a laser mirror having closely spaced coolant passages by depositing a material from a vapor on one side of a set of disposable cores which form the coolant passages in the finished product. The problem of depositing the vapor uniformly in small openings is solved by controlling the gas flow and heating.

BEST MODE FOR CARRYING OUT THE INVENTION

Figure 1:
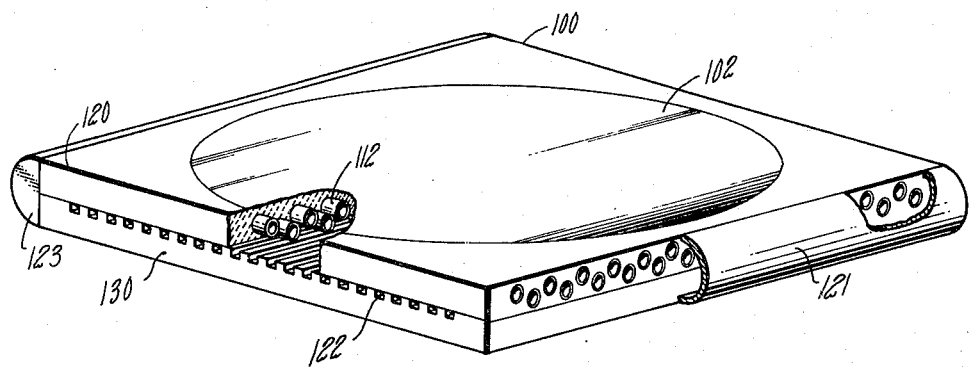
FIG. 1 illustrates an overall view of a cooled mirror constructed according to the invention.

In FIG. 1, mirror 100 is formed from a combination of faceplate 120 and substrate 130. The surface of faceplate 120 contains a polished section 102 that is illustratively circular in shape, though any shape may be used. The top portion of substrate 130 contains a number of grooves 122 that are machined with a rectangular cross section, though many other cross sections may be used. Substantially at right angles to the direction of grooves 122 there is disposed a number of coolant passages 112 that are closely spaced together, the upper row lying between the passages in the lower row. These coolant passages terminate in input and output manifolds 121 and 123.

Mirror 100 is formed by placing a number of tubes in predetermined positions above substrate 130 for the coolant passages 112. These tubes may be formed of a material that is easily dissolved in acid, such as copper. Faceplate 120 is formed by chemical vapor deposition of material on the outer surfaces of the copper tubes. Illustratively, the chemical vapor flows through channels 122 which are plated with material such as chrome to which the chemical does not adhere. The chemical then rises through the array of tubes, depositing on the surface as it does so and is then exhausted from the top surface of the tube layer through conventional means not shown. The material solidifies in and around tubes 112 and also bonds the mass so formed to the top surface of substrate 130. After the bottom surface is closed off and bonded to the substrate, the gas flow is switched to the top of the tube array and the deposition of material is completed. The gas is formed, heated, pumped and contained within conventional means known in the art of chemical vapor deposition which are omitted from the drawing for clarity. After a solid mass of chemical material has been formed, the material which forms the tube form, such as copper, is dissolved, leaving a number of holes having the same shape as the copper. The copper tubes need not be cylinders as shown in the drawing, but may be dimpled or otherwise contoured to provide turbulent flow. The surface of the tubes may be textured by sandblasting or other means to provide a rough surface on the interior of the coolant passages, thus enhancing heat transfer. The top surface 102 of the faceplate 120 is then machined to the desired contour and polished to an optical finish. Manifolds 121 and 123 are attached to distribute coolant through passages 112. Slots 122 remain as they are, having the feature of providing a degree of thermal isolation between the faceplate and the substrate, thus reducing distortion of the optical surface.

One example of a suitable material for the mirror is tungsten which is difficult to machine and to obtain in large stock sizes. Other suitable materials for a mirror are silicon or silicon carbide, both of which are difficult to machine but have desirable thermal properties. The faceplate and the substrate need not be of the same material, it being an advantageous feature of the subject invention that dissimilar materials may be more easily combined with the low temperature CVD process than with the relatively high temperature brazing process.

Figure 2:
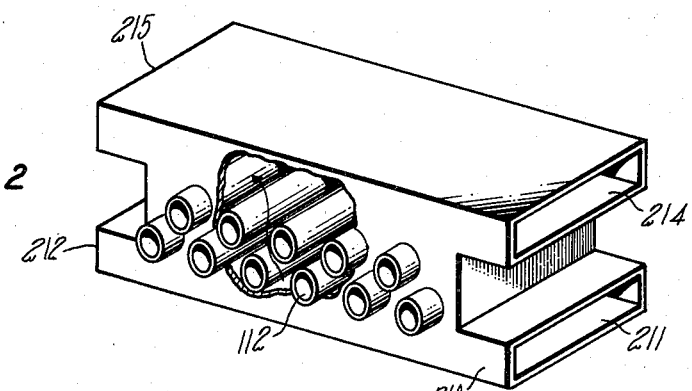
FIG. 2 illustrates the fabrication of an embodiment of the invention having two levels of coolant passages.

FIG. 2 illustrates a step in the fabrication of a mirror according to the invention. In this case, the faceplate 120 is to be formed in a single unit which is then to be attached to a substrate which is formed separately. In order to form the greatest amount and uniformity of cooling, it is important to space the coolant passages closely together. The passages are then separated by relatively thin walls with a danger that the narrow spaces will be blocked during the deposition process and voids will be formed in the final faceplate. The coolant tube forms 112 are enclosed by enclosure 210 having walls bonded to the tubes and four ports 211, 212, 214 and 215 for the entrance and exit of the gases involved in the process. The heated CVD gas enters port 211, passes upwards through the tube array as shown in the arrow, part of it continuing out through port 212. At the same time, an inert gas enters port 214, flows above the tube array where it mixes with a portion of the CVD gas and exits port 215. The pressures and flow rates of the gases are adjusted so that a portion of the CVD gas is drawn upwards through the tube array and mixed with the heated gas to stimulate preferential deposition of the material within the region between the two tube arrays. After the narrow spaces between the two tube arrays have been filled, the CVD gas continues to deposit on the bottom. It may then be switched to flow above the tube array extending the material deposited as high above the upper tube array as is desired. After a solid mass of CVD material is formed, the enclosure is removed and the copper tube forms are etched out of the CVD material. Inlet and exit coolant manifolds are attached to the CVD material as before, and a substrate is also attached. The method of copending patent application Ser. No. 251,680 may be used to attach the CVD material to the substrate by means of CVD bonding, advantageously employing a lower temperature than would a brazing process.

Figure 3:
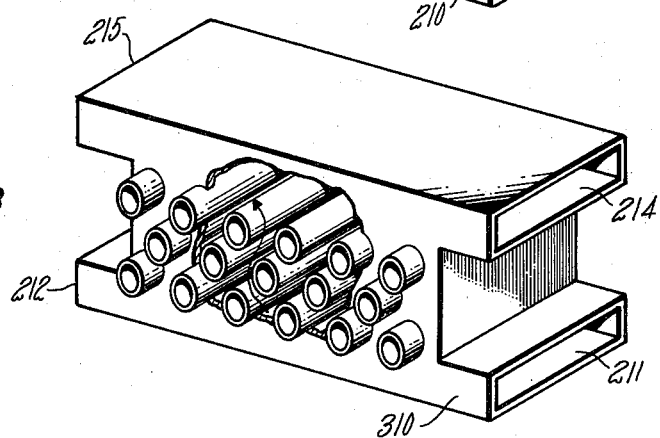
FIG. 3 illustrates the fabrication of an embodiment of the invention having three levels of coolant passages.

FIG. 3 illustrates a method of fabricating a faceplate according to the invention in which three levels of coolant passages are employed. In this case CVD gas enters the top and the bottom of enclosure 310, entering through ports 211 and 214 and exiting through ports 212 and 215. The central row 305 of tubes 112 is heated by passage of a heated gas through the empty coolant tube forms. The CVD material then deposits preferentially on the inner, heated tube array thus depositing first on the inner materials and thereby reducing enclosure of voids between the tubes. It will be evident that the upper and lower tube arrays may also be heated either at the same time or subsequent to the deposition of material around the middle tube array.

I claim:

1. A method of forming a cooled laser mirror comprising the steps of:
   (a) positioning a plurality of disposable cores for coolant passages at predetermined positions in a coolant passage array;
   (b) depositing material from a chemical vapor on said plurality of disposable cores in sufficient volume to band together said plurality of disposable cores in a mirror faceplate;
   (c) removing said disposable cores, whereby coolant passages remain in said mirror faceplate;
   (d) attaching coolant inlet and outlet means to said coolant passages; and
   (e) polishing one side of said mirror faceplate.

2. A method according to claim 1, in which said step of depositing material on said disposable cores comprises the further steps of:
   (a) enclosing said plurality of disposable cores with an enclosure having a plurality of inlet and outlet ports;
   (b) passing chemical vapor into a first inlet port on a first side of said plurality of disposable cores at a first mass flow, temperature and pressure;
   (c) passing an inert gas into a second inlet port on a second side of said plurality of disposable cores at a second mass flow, temperature and pressure, said second gas parameters being related to said first gas parameters such that chemical vapor flows from said first inlet port on said first side through said plurality of disposable cores toward said second side, whereby interstices in said plurality of disposable cores are preferentially filled with said material;
   (d) removing said chemical vapor from a first outlet port on said first side; and
   (e) removing a mixture of said inert gas and said chemical vapor from a second outlet port on said second side, the pressures in said first and second outlet ports being regulated to affect the amount of flow of said chemical vapor through said plurality of disposable cores.

3. A method according to claim 1, in which said step of depositing material further comprises:
   (a) enclosing said plurality of disposable cores with an enclosure having a plurality of inlet and outlet ports;
   (b) flowing chemical vapor at a first pressure, into a first inlet port and out of a first outlet port, said first ports being disposed on a first side of said plurality of disposable cores;
   (c) flowing chemical vapor at a second pressure into a second inlet port and out of a second outlet port, said second port being disposed on a second side of said plurality of disposable cores, said second pressure being less than said first pressure, whereby chemical vapor flows from said first side through interstices in said plurality of disposable cores toward said second side, thereby depositing said material in said interstices.

4. A method according to any of claims 1, 2 or 3, in which some of said plurality of disposable cores are heated.

* * * * *